United States Patent
Lee et al.

(10) Patent No.: US 9,851,425 B2
(45) Date of Patent: Dec. 26, 2017

(54) BACKGROUND-SUPPRESSED MYELIN WATER IMAGING

(71) Applicant: The Trustees of The University of Pennsylvania, Philadelphia, PA (US)

(72) Inventors: Jongho Lee, Bryn Mawr, PA (US); Sehong Oh, Philadelphia, PA (US)

(73) Assignee: The Trustees of the University of Pennsylvania, Philadelphia, PA (US)

(*) Notice: Subject to any disclaimer, the term of this patent is extended or adjusted under 35 U.S.C. 154(b) by 373 days.

(21) Appl. No.: 14/647,664

(22) PCT Filed: Nov. 26, 2013

(86) PCT No.: PCT/US2013/071864
§ 371 (c)(1),
(2) Date: May 27, 2015

(87) PCT Pub. No.: WO2014/085384
PCT Pub. Date: Jun. 5, 2014

(65) Prior Publication Data
US 2015/0301140 A1    Oct. 22, 2015

Related U.S. Application Data

(60) Provisional application No. 61/731,773, filed on Nov. 30, 2012.

(51) Int. Cl.
*G01R 33/56* (2006.01)
*G06T 7/00* (2017.01)
(Continued)

(52) U.S. Cl.
CPC ..... *G01R 33/5602* (2013.01); *G01R 33/3607* (2013.01); *G01R 33/5607* (2013.01);
(Continued)

(58) Field of Classification Search
CPC ............ G01R 33/5602; G01R 33/3607; G01R 33/5607; G06T 7/0012; G06T 2207/30016; G06K 9/46; G06K 2009/4666
See application file for complete search history.

(56) References Cited

U.S. PATENT DOCUMENTS 5,617,861 A * 4/1997 Ross ..................... A61B 5/055
600/410
8,148,979 B1 * 4/2012 Du ..................... G01R 33/4816
324/307

(Continued)

OTHER PUBLICATIONS

Arhelger et al, "Rapid Simultaneous Mapping Of Total and Myelin Water Content, T1 and T2 in Multiple Sclerosis", Aug. 2010, 1-27.

(Continued)

*Primary Examiner* — G. M. Hyder
(74) *Attorney, Agent, or Firm* — Baker & Hostetler LLP

(57) ABSTRACT

A technique and associated imaging system is provided that selectively acquires the myelin water signal by utilizing a multiple inversion RF pulses to suppress a range of long $T_1$ components including those from axonal and extracellular water. This leaves the myelin water, which has been suggested to have short $T_1$, as the primary source of the image. After long $T_1$ suppression, the resulting image is dominated by short $T_2$ in the range of the myelin water ($T_2^* < 20$ ms at 3 T). This result confirms that the short $T_1$ component has short $T_2^*$ and, therefore, the resulting image is a myelin water image.

12 Claims, 6 Drawing Sheets

(51) Int. Cl.
G06K 9/46 (2006.01)
G01R 33/36 (2006.01)
(52) U.S. Cl.
CPC .............. G06K 9/46 (2013.01); G06T 7/0012 (2013.01); G06K 2009/4666 (2013.01); G06T 2207/30016 (2013.01)

(56) References Cited

U.S. PATENT DOCUMENTS

| | | | |
|---|---|---|---|
| 2005/0148858 A1* | 7/2005 | Hargreaves | A61B 5/055 600/410 |
| 2006/0214659 A1 | 9/2006 | Larson et al. | |
| 2007/0080685 A1 | 4/2007 | Bydder et al. | |
| 2007/0255129 A1 | 11/2007 | Du et al. | |
| 2009/0009167 A1 | 1/2009 | Du | |
| 2009/0312625 A1* | 12/2009 | Du | G01R 33/485 600/410 |
| 2012/0019243 A1* | 1/2012 | Takahashi | G01R 33/4816 324/309 |
| 2012/0197105 A1* | 8/2012 | Mezer | A61B 5/055 600/410 |
| 2014/0180061 A1* | 6/2014 | Warntjes | G01R 33/50 600/416 |
| 2014/0270453 A1* | 9/2014 | Guo | G06T 5/002 382/131 |
| 2015/0301144 A1* | 10/2015 | Griswold | G01R 33/56563 324/309 |

OTHER PUBLICATIONS

Balaban et al, "Magnetization Transfer Contrast In Magnetic Resonance Imaging", Magnetic Resonance Quarterly, Jun. 1992, 8(2),116-137.
Basser et al, "MR Diffusion Tensor Spectroscopy And Imaging", Biophysical Journal, Jan. 1994, 66(1), 259-267.
Bluestein et al, "T1 And Proton Density At 7 T In Patients With Multiple Sclerosis: An Initial Study", Magnetic Resonance Imaging, Jan. 2012, 30(1), 19-25.
Cho et al, "Establishing Norms For Age-Related Changes In Proton T1 Of Human Brain Tissue In Vivo", Magnetic Resonance Imaging, Dec. 1997, 15(10),1133-1143.
Cohen-Adad et al, "$T_2^*$ Mapping And $B_0$ Orientation-Dependence At 7 t Reveal Cyto- And Myeloarchitecture Organization Of The Human Cortex", Apr. 2, 2012, 60(2), 1006-1014.
Cover et al, "A Robust And Reliable Method For Detecting Signals Of Interest In Multiexponential Decays", Review of Scientific Instruments, May 2008, 79(5),055106.
Deoni et al, "Correction Of Main And Transmit Magnetic Field (B0 and B1) Inhomogeneity Effects In Multicomponent-Driven Equilibrium Single-Pulse Observation Of T1 and T2", Magnetic Resonance in Medicine, Apr. 2011, 65(4),1021-1035.
Deoni et al, "Investigating White Matter Development In Infancy And Early Childhood Using Myelin Water Faction And Relaxation Time Mapping", NeuroImage, Nov. 2012, 63, 1038-1053.
Deoni et al, "Rapid Combined T1 and T2 Mapping Using Gradient Recalled Acquisition in the Steady State", Magnetic Resonance in Medicine, Mar. 2003, 49,515-526.
Does, MD. And Gore, JC., "Compartmental Study Of T1 and T2 in Rat Brain And Trigeminal Nerve In Vivo", Magnetic Resonance in Medicine, Feb. 2002, 47(2), 274-283.
Du et al, "Fast Multislice Mapping Of The Myelin Water Fraction Using Multicompartment Analysis Of $T_2^*$ Decay At 3T: A Preliminary Postmortem Study", Magnetic Resonance in Medicine, Nov. 2007, 58(5), 865-870.
Duijn et al, "Human Brain Infarction: Proton MR Spectroscopy", Radiology, Jun. 1992, 183(3), 711-718.
Duyn et al, "High-Field MRI Of Brain Cortical Substructure Based On Signal Phase", Proceedings Of The National Academy Of Sciences, Jul. 10, 2007, 104(28), 11796-11801.
Duyn et al, "High-Sensitivity Single-Shot Perfusion-Weighted fMRI", Magnetic Resonance in Medicine, Jul. 2001, 46, 88-94.
Gambarota et al, "Osmotic Effects On The T2 Relaxation Decay Of In Vivo Muscle", Magnetic Resonance in Medicine, Sep. 2001, 46(3), 592-599.
Gass et al, "Correlation Of Magnetization Transfer Ratio With Clinical Disability In Multiple Sclerosis", Annals of Neurology, Jul. 1994, 36(1), 62-67.
Ghugre et al, "Improved R2* Measurements In Myocardial Iron Overload", Journal of Magnetic Resonance Imaging, Jan. 2006, 23, 9-16.
Henkelman, M., "Measurement Of Signal Intensities In The Presence Of Noise In MR Images", Medical Physics, Mar.-Apr. 1985, 12(2), 232-233.
Hwang et al, "Improved Myelin Water Quantification Using Spatially Regularized Non-Negative Least Squares Algorithm", Journal of Magnetic Resonance Imaging, Jul. 2009, 30(1), 203-208.
Hwang et al, "In Vivo Multi-Slice Mapping Of Myelin Water Content Using T2* Decay", NeuroImage, Aug. 1, 2010, 52(1), 198-204.
International Application No. PCT/US2013/071864: International Search Report and Written Opinion dated Apr. 16, 2014, 8 pages.
Kalantari et al, "Insight Into In Vivo Magnetization Exchange In Human White Matter Regions", Magnetic Resonance in Medicine, Oct. 2011, 66(4), 1142-1151.
Koenig et al, "Relaxometry of Brain: Why White Matter Appears Bright In MRI",Jun. 1990, 14(3), 482-495.
Kolind et al, Myelin Water Imaging Development At 3.0T Application to the Study of Multiple Sclerosis and Comparison to Diffusion Tensor Imaging, Dec. 2008, 185 pages; http://circle.ubc.ca/bitstream/handle/2429/2922/ubc_2009_spring_kolind_shannon.pdf?
Kolind et al, "Myelin Water Imaging: Implementation And Development At 3.0T and Comparison To 1.5T Measurements", Magnetic Resonance in Medicine, Jul. 2009, 62(1), 106-115.
Labadie et al, "Comparison of Myelin Water Fraction in Cross-Regularized T1-Relaxograms of Normal White Matter at 3T and 7T and of Normal-Appearing White Matter at 3T", Proceedings International Society Magnetic Resonance in Medicine, Apr. 17, 2009, 3210.
Lancaster et al, "Three-Pool Model of White Matter", Journal Of Magnetic Resonance Imaging, Jan. 2003, 17, 1-10.
Lee et al, "Sensitivity of MRI Resonance Frequency To The Orientation Of Brain Tissue Microstructure", Proceedings Of The National Academy Of Sciences, Mar. 16, 2010, 107(11), 5130-5135.
Lee et al, "T2*-Based Fiber Orientation Mapping", Jul. 1, 2011, 57(1), 225-234.
Lenz et al, "Feasibility Of In Vivo Myelin Water Imaging Using 3D Multigradient-Echo Pulse Sequences", Magnetic Resonance in Medicine, Aug. 2012, 68(2), 523-528.
Li et al, "Mapping Magnetic Susceptibility Anisotropies Of White Matter In Vivo In The Human Brain At 7 T", NeuroImage, Aug. 2012, 62(1), 314-330.
Liu, C., "Susceptibility Tensor Imaging", Magnetic Resonance in Medicine, Jun. 2010, 63(6), 1471-1477.
Mackay et al, "In Vivo Visualization Of Myelin Water In Brain By Magnetic Resonance", Jun. 1994, 31(6), 673-677.
Menon, RS and Allen, PS, "Application Of Continuous Relaxation Time Distributions To The Fitting Of Data From Model Systems And Excised Tissue", Magnetic Resonance in Medicine, Aug. 1991, 20(2), 214-227.
Miller et al, "Asymmetries of the balanced SSFP profile. Part II: White matter", Magnetic Resonance in Medicine, Feb. 2010, 63(2), 396-406.
Oh et al, "Measurement Of In Vivo Multi-Component T2 Relaxation Times For Brain Tissue Using Multi-Slice T2 Prep at 1.5 and 3 T", Magnetic Resonance Imaging, Jan. 2006, 24(1), 33-43.
Parry et al, "White Matter And Lesion T1 Relaxation Times Increase In Parallel And Correlate With Disability In Multiple Sclerosis", Journal of Neurology, Sep. 2002, 249, (9), 1279-1286.
Stanisz et al, "T1, T2 Relaxation And Magnetization Transfer In Tissue At 3T", Magnetic Resonance in Medicine, 54(3), 507-512, Sep. 2005.

(56) References Cited

OTHER PUBLICATIONS

Stikov et al, "Bound Pool Fractions Complement Diffusion Measures To Describe White Matter Micro And Macrostructure", NeuroImage, Janaury 15, 2011, 54(2), 1112-1121.
Van Gelderen et al, "Nonexponential $T_2$ Decay In White Matter", Magnetic Resonance in Medicine, Jan. 2012, 67(1),110-117.
Vasilescu, "Water Compartments In The Myelinated Nerve. III. Pulsed NMR Result", Nov. 1978, Experientia, 34(11), 1443-1444.
Werring et al, "Diffusion Tensor Imaging Of Lesions And Normal-Appearing White Matter In Multiple Sclerosis", Neurology, May 12, 1999, 52(8),1626-32.
Whittall, K.P. and MacKay, A.L., "Quantitative Interpretation Of NMR Relaxation Data", Journal of Magnetic Resonance, Aug. 1989, 84(10, 134-152.
Wilhelm et al, "Direct Magnetic Resonance Detection Of Myelin And Prospects For Quantitative Imaging Of Myelin Density", Proceedings Of The National Academy Of Sciences, Jun. 12, 2012, 109(24), 9605-9610.

\* cited by examiner

BACKGROUND-SUPPRESSED MYELIN WATER IMAGING

CROSS-REFERENCE TO RELATED APPLICATIONS

This application is the National Stage of International Application No. PCT/US2013/071864 filed Nov. 26, 2013, which claims the benefit of and priority to U.S. Provisional Application No. 61/731,773, filed Nov. 30, 2012, the entireties of which applications are incorporated herein by reference for any and all purposes.

GOVERNMENT RIGHTS

This invention was made with government support under Grant No. 8P41-EB015893 awarded by the National Center for Research Resources, NIBIB of NIH and Penn Comprehensive Neuroscience Center Pilot Grant, University of Pennsylvania. The government has certain rights in the invention.

TECHNICAL FIELD

The invention relates to a new pulse sequence and magnetic resonance imaging devices and methods for background suppressed myelin water imaging (MWI) that measures signals from water molecules in the gap of neighboring myelin layers in white matter in the brain.

BACKGROUND

In the brain, oligodendrocytes form myelin sheaths around axons to insulate signal conduction. In certain neurological disorders such as multiple sclerosis, the degeneration of myelin sheaths can induce disabilities in patients. Therefore, developing myelin or myelin-related biomarkers has important clinical values for the diagnosis and prognosis of such diseases. Several MRI methods including myelin water imaging (Mackay, et al., 1994, In vivo visualization of myelin water in brain by magnetic resonance. Magn Reson Med 31, 673-677), magnetization transfer imaging (Balaban, et al., 1992, Magnetization transfer contrast in magnetic resonance imaging. Magn Reson Q 8, 116-137; Gass, et al., 1994, Correlation of magnetization transfer ration with clinical disability in multiple sclerosis, Ann Neurol 36, 62-67), and diffusion tensor imaging (Basser, et al., 1994, MR diffusion tensor spectroscopy and imaging. Biophys J 66, 259-267; Werring, et al., 1999, Diffusion tensor imaging of lesions and normal-appearing white matter in multiple sclerosis, Neurology 52, 1626-1626) have been proposed as potential biomarkers for myelin. Among these, myelin water imaging (MWI) measures signals from water molecules in the gap between neighboring myelin layers in white matter. It has been suggested that this fraction of water has more rapid transverse (Du, et al., 2007, Fast multislice mapping of the myelin water fraction using multicompartment analysis of T2* decay at 3 T: a preliminary postmortem study, Magn Reson Med 58, 865-870; Mackay 1994; Menon, et al., 1991, Application of continuous relaxation time distributions to the fitting of data from model systems and excised tissue, Magn Reson Med 20, 214-227; van Gelderen, et al., 2012. Nonexponential T2* decay in white matter, Magn Reson Med 67, 110-117; Vasilescu, et al., 1978, Water compartments in the myelinated nerve. III. Pulsed NMR result, Experientia 34, 1443-1444) and longitudinal relaxations (Does, et al., 2002, Compartmental study of T1 and T2 in rat brain and trigeminal nerve in vivo, Magn Reson Med 47, 274-283; Koenig, et al., 1990, Relaxometry of brain: why white matter appears bright in MRI, Magn Reson Med 14, 482-495; Labadie, et al., 2009, Comparison of myelin water fraction in cross-regularized T1-relaxograms of normal white matter at 3 T and 7 T and of normal-appearing white matter at 3 T, Proceedings of the 17th Annual Meeting of ISMRM, Honolulu, Hi., p. 3210; Lancaster, et al., 2002, Three-pool model of white matter, J Magn Reson Imaging 17, 1-10; Stanisz, et al., 2005, T1, T2 relaxation and magnetization transfer in tissue at 3 T, Magn Reson Med 54, 507-512) than other water inside of axons or in the extracellular space outside of fibers. In conventional MWI, the transverse relaxations are measured by multi-echo GRE or SE sequences. Since the multiple water components have different relaxations, the measured signal shows a multiexponential decay. This decay is fitted with exponential decay basis functions to estimate the distribution of transverse relaxations (Whittall, et al., 1989, Quantitative interpretation of NMR relaxation data. JMR 84, 134-152). Then, the fraction of the short transverse relaxation component or myelin water, which is approximately in the range of $T_2 < 40$ ms and $T_2^* < 25$ ms at 3 T (Hwang, et al., 2010, In vivo multi-slice mapping of myelin water content using T2* decay, NeuroImage 52, 198-204; Kolind, et al., 2009, Myelin water imaging: implementation and development at 3.0 T and comparison to 1.5 T measurements, Magn Reson Med 62, 106-115; Oh, et al., 2006, Measurement of in vivo multi-component T2 relaxation times for brain tissue using multi-slice T2 prep at 1.5 and 3 T, Magn Reson Imaging 24, 33-43), relative to the total water is calculated to generate a myelin water image. However, the fitting process is ill-conditioned and the resulting MWI is sensitive to noise and artifacts (Cover, K. S., 2008, A robust and reliable method for detecting signals of interest in multiexponential decays, Rev Sci Instrum 79, 055106-055101 055106-055111; Whittall, et al., 1989).

An MRI pulse sequence sensitive to myelin water, a potential biomarker for myelin, is desired that better distinguishes between the bound water between myelin layers and water found in edema or inflammation, which contains a high component of free water. More generally, an improved technique for myelin water imaging is desired that better distinguishes the bound water between myelin layers and the other water in the brain.

SUMMARY

In accordance with the invention, a myelin water image is acquired by suppressing signals from long $T_1$ components so that a short $T_1$ signal, which the inventors have shown by experiment to originate from the myelin water, dominates the image. For the suppression, double or multiple inversion RF pulses are used to suppress background water signals unrelated to the myelin water. For this reason, this method is referred to as background-suppressed myelin water imaging (BS-MWI) or Direct Visualization of Short Transverse Relaxation Time Component (ViSTa). An excitation (imaging) pulse is applied after inversion RF pulses and the data is acquired for display of the myelin water image. The method generates substantially improved image quality demonstrating potential for clinical use. Also, the BS-MWI does not require multiple echoes and can generate MWIs near an inhomogeneous field with no compensation.

In an exemplary embodiment, a method and associated system of acquiring a myelin water image is provided that includes an RF pulse generator for applying RF pulses to suppress signals from long $T_1$ components so that a short $T_1$ signal including a myelin water component dominates a resulting image of a region of interest, such as a slice of or a whole brain of a patient, and for applying an excitation RF pulse (e.g., a 90° excitation pulse) to the region of interest. An data acquisition element acquires image data in the region of interest for display of a myelin water image. In exemplary embodiments, the long T1 suppression RF pulses comprise double or multiple inversion RF pulses sufficient to remove long T1 water signals unrelated to myelin water. For example, the long T1 suppression RF pulses may suppress T1 signals longer than 400 ms for 1.5 T or 3 T fields or longer than 500 ms for 7 T fields. The long T1 suppression and excitation pulses may define a pulse sequence, satisfying one of the following equations in accordance with the number of RF inversion pulses used:
for two inversion pulses:

$$M_{xy} = M_0(1-(2-(2-e^{-TD/T_1})e^{-T1_1/T_1})e^{-T1_2/T_1})e^{-TE/T_2*}$$

where $M_0$ is a fully relaxed magnetization value, $T1_1$ is a time duration from a first inversion RF pulse to a second inversion RF pulse, $T1_2$ is a time duration from the second inversion RF pulse to the excitation RF pulse, and TD is a time duration from the excitation RF pulse to a first inversion RF pulse in a subsequent pulse sequence $M_{xy}$, TE is an echo pulse duration, and $M_{xy}$ is a transverse magnetization after the excitation RF at TE;
for three inversion pulses:

$$M_{xy} = M_0(1-(2-(2-(2-e^{-TD/T_1})e^{-T1_1/T_1})e^{-T1_2/T_1}) e^{-T1_3/T_1})e^{-TE/T_2*}$$

where $M_0$ is a fully relaxed magnetization value, $T1_1$ is a time duration from a first inversion RF pulse to a second inversion RF pulse, $T1_2$ is a time duration from the second inversion RF pulse to the third inversion RF pulse, $T1_3$ is a time duration from the third inversion RF pulse to the excitation RF pulse, and TD is a time duration from the excitation RF pulse to a first inversion RF pulse in a subsequent pulse sequence, TE is an echo pulse duration, and $M_{xy}$ is a transverse magnetization after the excitation RF at TE;
for four inversion pulses:

$$M_{xy} = M_0(1-(2-(2-(2-(2-e^{-TD/T_1})e^{-T1_1/T_1})e^{-T1_2/T_1}) e^{-T1_3/T_1})e^{-T1_4/T_1})e^{-TE/T_2*}$$

where $M_0$ is a fully relaxed magnetization value, $T1_1$ is a time duration from a first inversion RF pulse to a second inversion RF pulse, $T1_2$ is a time duration from the second inversion RF pulse to the third inversion RF pulse, $T1_3$ is a time duration from the third inversion RF pulse to the fourth inversion RF pulse, $T1_4$ is a time duration from the fourth inversion RF pulse to the excitation RF pulse, and TD is a time duration from the excitation RF pulse to a first inversion RF pulse in a subsequent pulse sequence, TE is an echo pulse duration, and $M_{xy}$ is a transverse magnetization after the excitation RF at TE;
and so on.

These and other novel aspects of the invention will become apparent to those skilled in the art from the following detailed description.

BRIEF DESCRIPTION OF THE DRAWINGS

The various novel aspects of the invention will be apparent from the following detailed description of the invention taken in conjunction with the accompanying drawings, of which.

DETAILED DESCRIPTION OF ILLUSTRATIVE EMBODIMENTS

The invention will be described in detail below with reference to FIGS. 1-7. Those skilled in the art will appreciate that the description given herein with respect to those figures is for exemplary purposes only and is not intended in any way to limit the scope of the invention. All questions regarding the scope of the invention may be resolved by referring to the appended claims.

Multiple Inversion RF Pulses for Long $T_1$ Water Suppression

Figure 1:
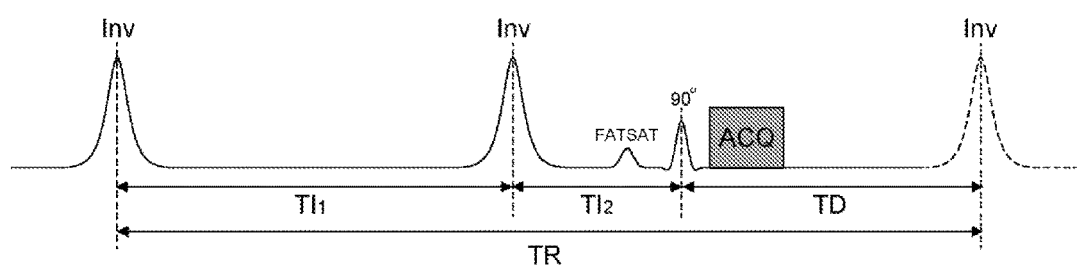
FIG. 1 shows a double inversion GRE sequence for the background-suppressed myelin water imaging (BS-MWI).
Figure 5:
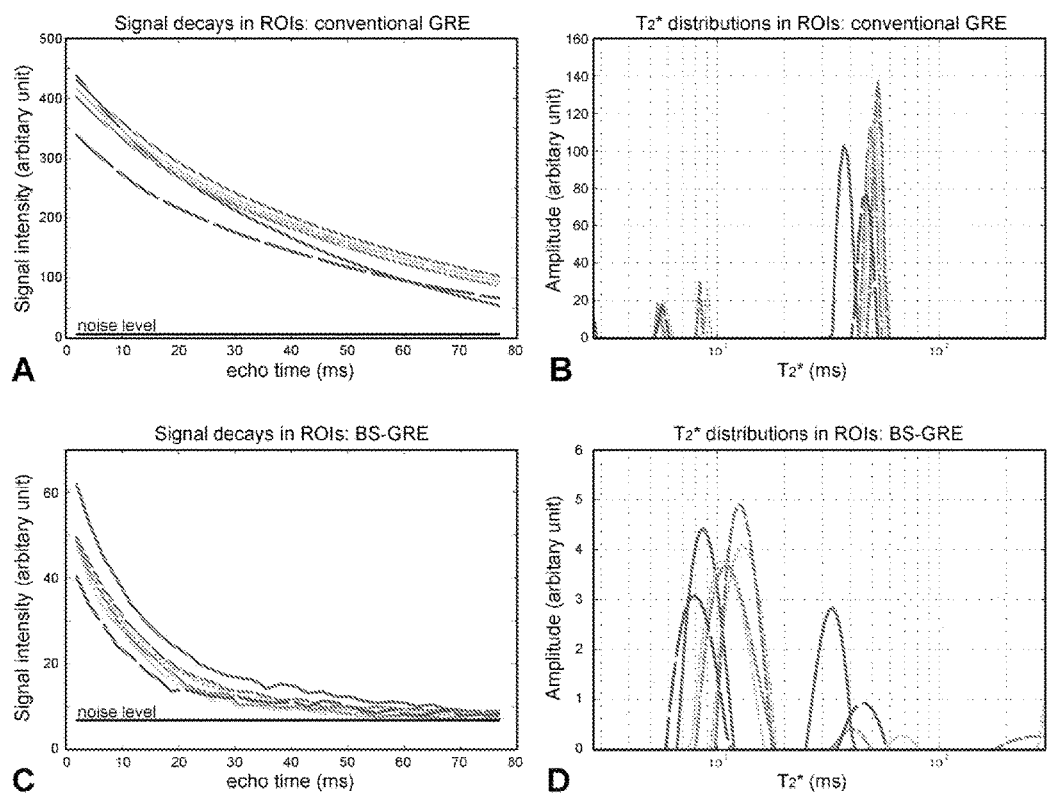
FIG. 5 shows signal decays over the 32 echoes in the conventional GRE (FIG. 5A) and the BS-GRE (FIG. 5C). The resulting $T_2*$ distributions (FIG. 5D) suggest that the primary $T_2*$ decays are less than 20 ms suggesting the signals are predominantly from the myelin water. On the other hand, the conventional MWI results (FIG. 5B) show the signal dominance from the long $T_2*$ components ($T_2*>20$ ms).
Figure 7:
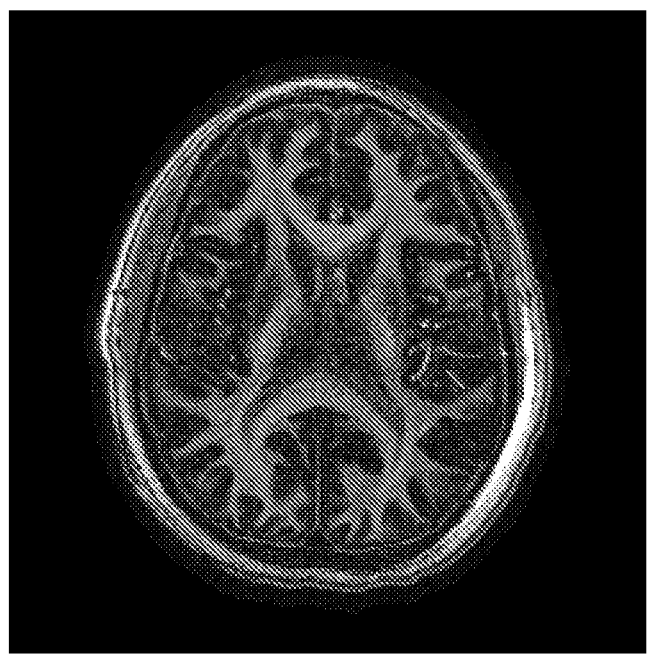
FIG. 7 shows high resolution (1×1×3 mm$^3$) background-suppressed MWI.

In white matter of the brain, multiple transverse relaxation components ($T_2$ and $T_2*$) have been observed (Du et al., 2007; Mackay et al., 1994; Menon and Allen, 1991; van Gelderen et al., 2012; Vasilescu et al., 1978). Some of these components (e.g. short $T_2$ and $T_2*$ component) have been associated to compartments (e.g. myelin water) (Mackay et al., 1994). In a few studies, not only transverse relaxation but also longitudinal relaxation ($T_1$) has been suggested to vary among the components. Similarly to the transverse relaxation, the shortest $T_1$ component was assumed to have originated from the myelin water whereas the other water components were from axonal and extracellular water (Does and Gore, 2002; Koenig et al., 1990; Labadie et al., 2009; Lancaster et al., 2002; Stanisz et al., 2005). If this is proven to be the case and if the long $T_1$ water components can be selectively suppressed, then the resulting image will be dominated by the myelin water signal. As described below, the suppression of long $T_1$ signals can be achieved by using an inversion recovery sequence. One inversion RF pulse can nullify a small fraction of $T_1$ relaxation and, hence, may not be able to suppress the range of long $T_1$ water components in white matter. On the other hand, a double or multiple of inversion RF pulse can be designed to suppress a wide range of $T_1$ as shown in FIG. 1. FIG. 1 shows a double inversion GRE sequence for the background-suppressed myelin water imaging (BS-MWI). The timing ($TI_1$=560 ms, $TI_2$=220 ms, and TD=380 ms) was optimized to suppress signals from T1 components >400 ms and to have maximum suppression in water signals in the range of 750 ms≤$T_1$≤5000 ms. A multi-echo readout was used to characterize a $T_2^*$ decay in white matter (FIG. 5). For a high resolution BS-MWI image, a single echo with a long readout duration (10 ms) was used to increase SNR (FIG. 7).

For example, when two inversion RF pulses are used, the transverse magnetization at an echo time (TE) after a 90° excitation can be written as follows (Duijn, et al., 1992, Human brain infarction: proton MR spectroscopy, Radiology, 183, 711-718; Duyn, et al., 2001, High-sensitivity single-shot perfusion-weighted fMRI. Magn Reson Med 46, 88-94):

$$M_{xy} = M_0(1-(2-(2-\epsilon^{-TD/T_1})\epsilon^{-TI_1/T_1})\epsilon^{-TI_2/T_1})\epsilon^{-TE/T_2*}$$

$$R_{2,apparent} = R_{2,intrisic} + R_{2,diffusion} + R_{2,exchange} \quad (Eq. 1)$$

where $M_0$ is a fully relaxed magnetization value, the three intervals ($TI_1$, $TI_2$, and TD) are the time between the RFs shown in FIG. 1, TE is an echo pulse duration, and $M_{xy}$ is a transverse magnetization after the excitation RF at TE. These intervals can be adjusted to suppress desired $T_1$. The sequence works then as a $T_1$-filter. The equation for three inversion pulses is:

$$M_{xy} = M_0(1-(2-(2-(2-\epsilon^{-TD/T_1})\epsilon^{-TI_1/T_1})\epsilon^{-TI_2/T_1})\epsilon^{-TI_3/T_1})\epsilon^{-TE/T_2*}$$

where $M_0$ is a fully relaxed magnetization value, $TI_1$ is a time duration from a first inversion RF pulse to a second inversion RF pulse, $TI_2$ is a time duration from the second inversion RF pulse to the third inversion RF pulse, $TI_3$ is a time duration from the third inversion RF pulse to the excitation RF pulse, and TD is a time duration from the excitation RF pulse to a first inversion RF pulse in a subsequent pulse sequence, TE is an echo pulse duration, and $M_{xy}$ is a transverse magnetization after the excitation RF at TE. Similarly, the equation for four inversion pulses is:

$$M_{xy} = M_0(1-(2-(2-(2-(2-\epsilon^{-TD/T_1})\epsilon^{-TI_1/T_1})\epsilon^{-TI_2/T_1})\epsilon^{-TI_3/T_1})\epsilon^{-TI_4/T_1})\epsilon^{-TE/T_2*}$$

where $M_0$ is a fully relaxed magnetization value, $TI_1$ is a time duration from a first inversion RF pulse to a second inversion RF pulse, $TI_2$ is a time duration from the second inversion RF pulse to the third inversion RF pulse, $TI_3$ is a time duration from the third inversion RF pulse to the fourth inversion RF pulse, $TI_4$ is a time duration from the fourth inversion RF pulse to the excitation RF pulse, and TD is a time duration from the excitation RF pulse to a first inversion RF pulse in a subsequent pulse sequence, TE is an echo pulse duration, and $M_{xy}$ is a transverse magnetization after the excitation RF at TE, and so on.

Suppressing a wide range $T_1$ is important because different regions of white matter have different $T_1$ values and, as noted below, the value may change with age and be affected by disease. Additionally, since the fraction of the myelin water is small (less than 20%), the long $T_1$ signals should be strong enough to have the majority of the signal originate from the myelin water.

Figure 2:
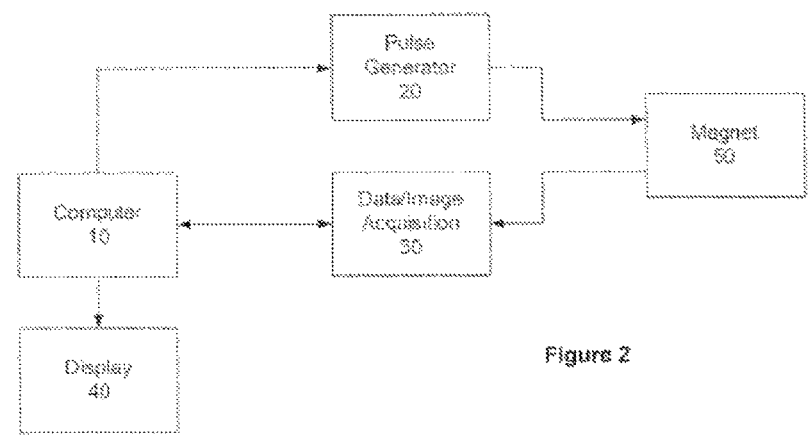
FIG. 2 is a block diagram of a magnetic resonance imaging system that may be programmed to generate pulse sequences in accordance with the invention.

FIG. 2 is a block diagram of a magnetic resonance imaging (MRI) system that may be programmed to generate pulse sequences in accordance with the invention. As illustrated in block form, the main components of an MRI system are a computer 10, an RF pulse generator 20, a data processing element 30 including gradient coils (not shown), a display 40 and a magnet 50. A person skilled in the art will recognize that the different elements are well known in the art and thus require no explanation as to their construction. The computer 10 in the system of FIG. 2 in accordance with the invention is programmed, or can be programmed, to carry out the described RF pulse generating methods described herein.

Those skilled in the art will appreciate that the computer 10 of FIG. 2 may be implemented as any suitable computing environment including a processor programmed to execute software routines adapted to control the pulse generator 20 to generate radiofrequency (RF) pulses as described herein as well as to control data acquisition through control of the timing of data acquisition and the associated generation of imaging gradients by data processing device 30. Those skilled in the art will also appreciate that the invention includes a machine or computer programmed by computer-executable instructions, such as program modules, so as to implement the methods described herein. The computer may be a client workstation, a server, a personal computer, or the like. Generally, the program modules include routines, programs, objects, components, data structures and the like that perform particular tasks or implement particular abstract data types. Moreover, it should be appreciated that the invention and/or portions thereof may be practiced with other computer system configurations, including hand-held devices, multi-processor systems, microprocessor-based or programmable consumer electronics, network PCs, mini-computers, mainframe computers and the like. The invention may also be practiced in distributed computing environments where tasks are performed by remote processing devices that are linked through a communications network. In a distributed computing environment, program modules may be located in both local and remote memory storage devices.

Those skilled in the art will further appreciate that the computer 10 may further include a device (not shown) for reading computer readable storage media such as a hard disk, a removable magnetic disk, and/or a removable optical disk such as a CD-ROM or other optical media. Such devices (e.g., hard disk drive) and their associated computer-readable storage media provide non-volatile storage of computer readable instructions, data structures, program modules and other data for the computer. It will be further appreciated by those skilled in the art that other types of computer readable media that can store data that is accessible by a computer may also be used to store software code for implementing the methods of the invention in the exemplary operating environment. Such other types of media include a magnetic cassette, a flash memory card, a digital video disk, a Bernoulli cartridge, a random access memory (RAM), a read-only memory (ROM), and the like. The invention includes such non-transitory computer readable storage media having instruction stored thereon that, when executed by a processor, cause the processor to implement the techniques of the invention as described below.

In experiments, the three intervals of $TI_1$, $TI_2$, and TD were chosen to have larger than 40% of fully relaxed magnetization ($M_0$) for $T_1$≤200 ms, 0.3% or less for 750 ms≤$T_1$≤2000 ms, and 0.5% or less for 2000 ms≤$T_1$≤5000 ms. The strict suppression at long $T_1$ is, in part, because of the fact that $T_1$ of the myelin water at 3 T is unknown and is challenging to measure. As a result, the sequence parameters were chosen to have minimal contribution from long $T_1$ while keeping a relatively large signal at short $T_1$. To find the parameters that satisfy this condition, a parameter search was performed on $TI_1$, $TI_2$, and TD over the range of 10 ms to 1000 ms in the step size of 10 ms. The optimal inversion timing that satisfied the condition was $TI_1=560$ ms, $TI_2=220$ ms, and $TD=380$ ms. The resulting transverse magnetization is shown in FIG. 3.

Figure 3:
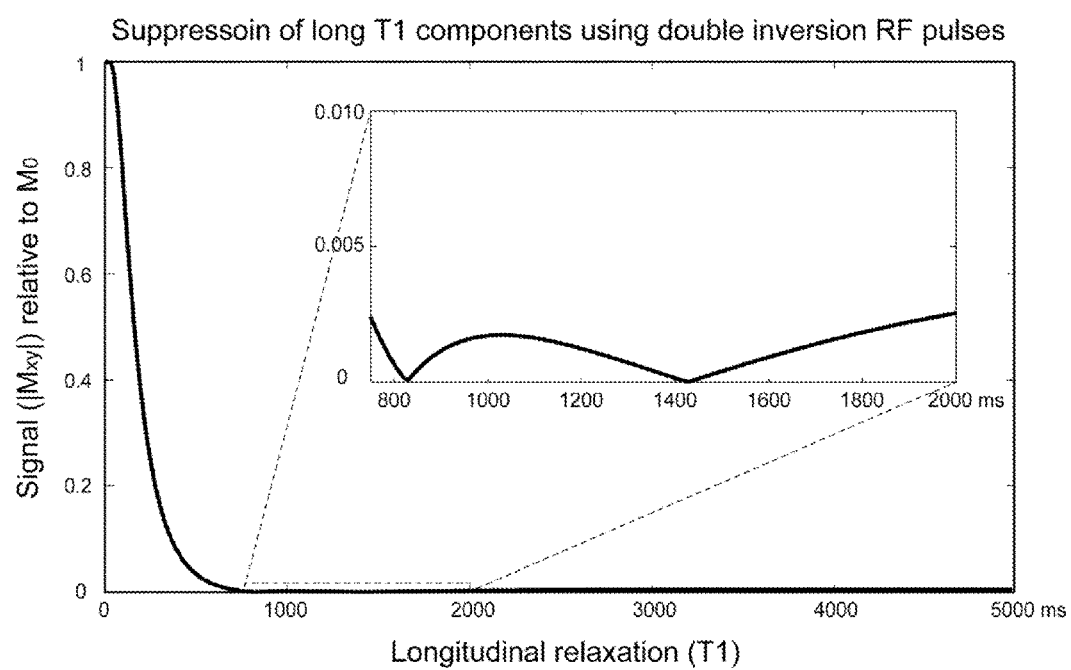
FIG. 3 shows a transverse magnetization as a function of $T_1$ in the BS-MWI sequence.

FIG. 3 shows a transverse magnetization as a function of $T_1$ in the BS-MWI sequence. The double inversion pulse enabled signal suppression over a wide range of long $T_1$ (750 ms≤$T_1$≤5000 ms). Gray matter and CSF were also suppressed to better visualize the myelin water in the resulting image. These parameters suppress signals not only from long $T_1$ in white matter, but also from gray matter ($T_1$=1500 ms at 3 T) and CSF ($T_1$=4000 ms at 3 T). This suppression helps to avoid bright areas and artifacts in the image. For the same reason, fat was also suppressed using a fat saturation pulse. Hence, almost all static signals in the brain except the myelin water signal were suppressed.

Data Acquisition

For MRI scans, 5 subjects (mean age=33±4 years), who signed consent forms approved by an institutional review board, were scanned at a 3 Tesla system (Tim Trio, Siemens, Erlangen, Germany). The scan started with a localizer, followed by a region-of-interest shimming over the brain area including the imaging slices. The following scans were performed.

Scan 1) BS-MWI using a double inversion prepared multi-echo GRE sequence (BS-GRE sequence): single slice, FOV=240 mm$^2$, resolution=1.88×1.88 mm$^2$, slice thickness=3 mm, TR=1160 ms, $TI_1$=560 ms, $TI_2$=220 ms, TD=380 ms, TE=1.85:2.42:77 ms, number of echoes=32, flip angle=90°, matrix size=128×128, bandwidth=720 Hz/pixel, scan time=2 min 30 sec. For the inversion, a non-selective hyperbolic secant RF pulse was used.

Scan 2) Conventional MWI using a multi-echo GRE sequence of a long TR (=1160 ms): The same sequence structure as Scan 1 without the inversion RF pulses was used. The scan parameters were the same except the flip angle (=78°) which was set to the Ernst angle for white matter at $T_1$=750 ms. The scan time was 2 min 30 sec.

Scan 3) Conventional MWI using a multi-echo GRE sequence of a short TR (=97 ms): The same scan parameters as Scan 2 was used except TR (=97 ms) and flip angle (=29°; Ernst angle). The data was collected 12 times and averaged to match the total scan time of 2 min 30 sec.

Scan 4) High-resolution BS-MWI using a single but long readout: FOV=256 mm$^2$, resolution=1×1 mm$^2$, slice thickness=3 mm, TR=1160 ms, $TI_1$=560 ms, $TI_2$=220 ms, TD=380 ms, TE=6.36 ms, number of echoes=1, matrix size=256×256, bandwidth=100 Hz/pixel, readout duration=10 ms, two averages, and total scan time=9 min 56 sec.

For Scan 1, 2 and 3, two slices, one including genu and splenium areas of corpus callosum and the other 3 cm superior, were acquired one slice at a time. For Scan 4, only the lower slice was acquired.

Data Analysis

Before the analysis, images were carefully checked for subject motion to ensure alignment within (Scan 3 and 4) and between the scans (Scan 1, 2 and 3). All images showed negligible motion. The multiple repetition images were averaged for each scan (Scan 3 and 4).

When the two conventional GRE images (Scan 2 and Scan 3) were compared, the images from the long TR (Scan 2) showed artifacts at late echoes in a few subjects whereas no such artifacts were observed in the short TR data (Scan 3). As a result, the data from Scan 3 were chosen for analyses that require multi-echo images. For Scan 2, only the first image was used to generate a coil sensitivity map for the high-resolution BS-MWI images.

To characterize the multi-component $T_2^*$ decays in the BS-GRE data (Scan 1) and the conventional GRE data (Scan 3), a region-of-interest (ROI) analysis was performed at six ROIs: genu, splenium, left posterior white matter, right posterior white matter, left superior white matter, and right superior white matter. The ROIs were manually drawn in the two slices (FIGS. 4A and 4B). In each ROI, a mean decay curve was generated by averaging signals in the ROI. The distribution of the multiple components was estimated by fitting the mean decay curve with multiple exponential $T_2^*$ decays (Whittall and MacKay, 1989):

$$y_l = \sum_{k=1}^{M} s_k \exp\left(-\frac{t_l}{T_{2k}^*}\right), l = 1, 2, ..., N \quad \text{(Eq. 2)}$$

where $t_i$ is an echo time, $y_i$ is the measured decay at $t_i$, N is the total number of echoes (=32), and $s_k$ and $T_{2k}^*$ are the relative amplitude and $T_2^*$ for each component respectively. M is the number of $T_2^*$ decay components in the model and was set to 300. $T_{2k}^*$ was spaced logarithmically from 2.77 ms (=1.5×$TE_1$) to 300 ms (Lenz, et al., 2011, Feasibility of in vivo myelin water imaging using 3D multigradient-echo pulse sequences, Magn Reson Med 68, 523-528). A regularized nonnegative least-square (NNLS) fitting method, which is widely used in MWI, was utilized with the following regularization to generate a robust fit in the presence of noise (Whittall and MacKay, 1989):

$$\chi^2 + \mu \sum_{k=1}^{M} s_k^2, \mu \geq 0 \quad \text{(Eq. 3)}$$

$$1.02\chi_{min}^2 \leq \chi^2 \leq 1.025\chi_{min}^2 \quad \text{(Eq. 4)}$$

where $\chi^2$ is a residual sum of squares.

In the BS-GRE images, the SNR was low (9.4±0.6 at the first-echo averaged over all ROIs in all subjects) and, therefore, non-zero mean noise distribution of the magnitude images resulted in a constant offset in the decay curves (Henkelman, R. M., 1985, Measurement of signal intensities in the presence of noise in MR images, Med Phys 12, 232-233). This offset biases the $T_2^*$ estimation and, therefore, was subtracted from the data before the fitting process (Gambarota, et al., 2001, Osmotic effects on the T2 relaxation decay of in vivo muscle, Magn Reson Med 46, 592-599; Ghugre, et al., 2005, Improved R2* measurements in myocardial iron overload, J Magn Reson Imag 23, 9-16). The offset was estimated by averaging a small background noise area outside of the images. The same correction was applied to the conventional GRE data although SNR was much higher (252.2±8.5 at the first echo averaged over all ROIs in all subjects).

The regularized NNLS fitting resulted in the distribution of the $T_2^*$ decays. $T_2^*$ components less than 20 ms were regarded as the myelin water. For the conventional MWI, the myelin water fraction was calculated as a ratio between sum of the myelin water components and sum of all components.

For BS-MWI, the first five echoes (TE from 1.85 to 11.53 ms) of the BS-GRE images were averaged to generate a BS-MWI image. Then the image was compared with the conventional myelin water fraction image.

Figure 6:
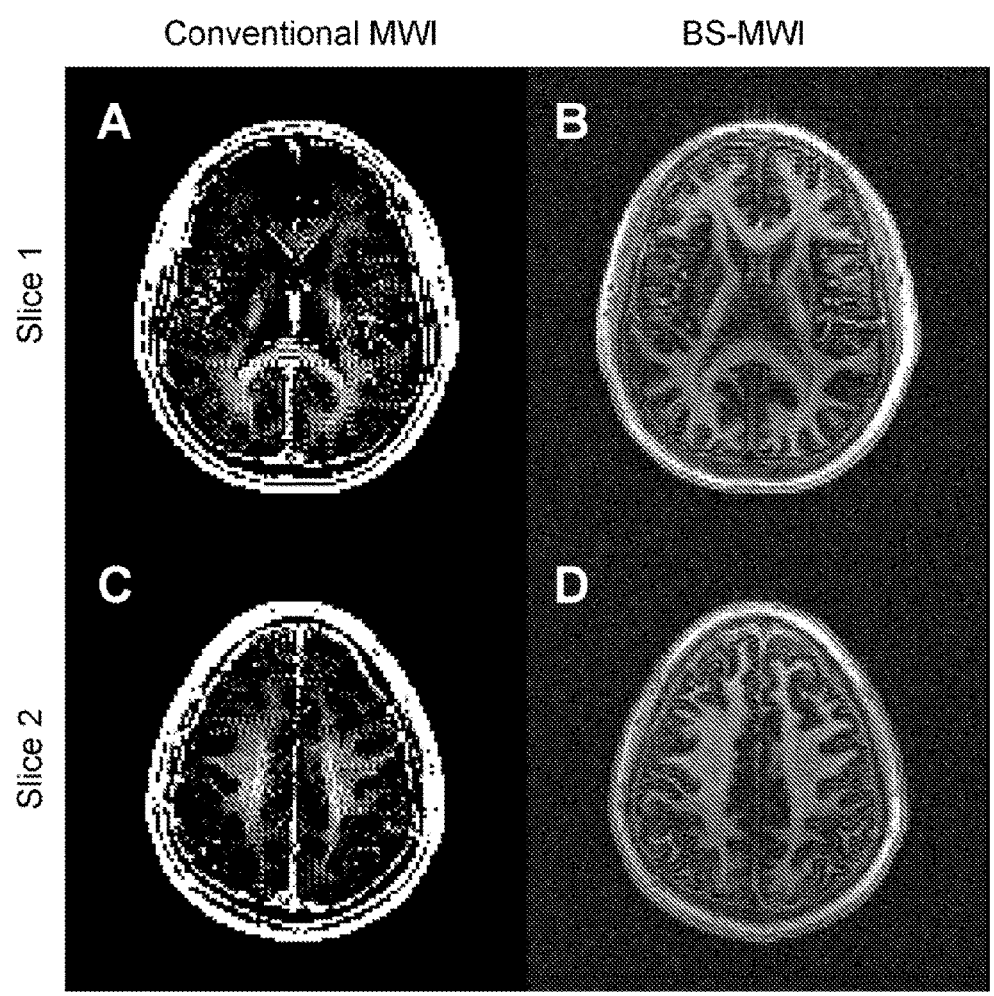
FIG. 6 illustrates conventional MWI (FIGS. 6A and 6C) vs. background-suppressed MWI (FIGS. 6B and 6D).

The high resolution BS-MWI images acquired in Scan 4 were corrected for the coil sensitivity profile generated from the first echo image of Scan 2 after a low-pass filtering. It resulted in a relatively uniform myelin water image less biased by the multi-channel coil sensitivity (FIG. 6).

Results

Figure 4:
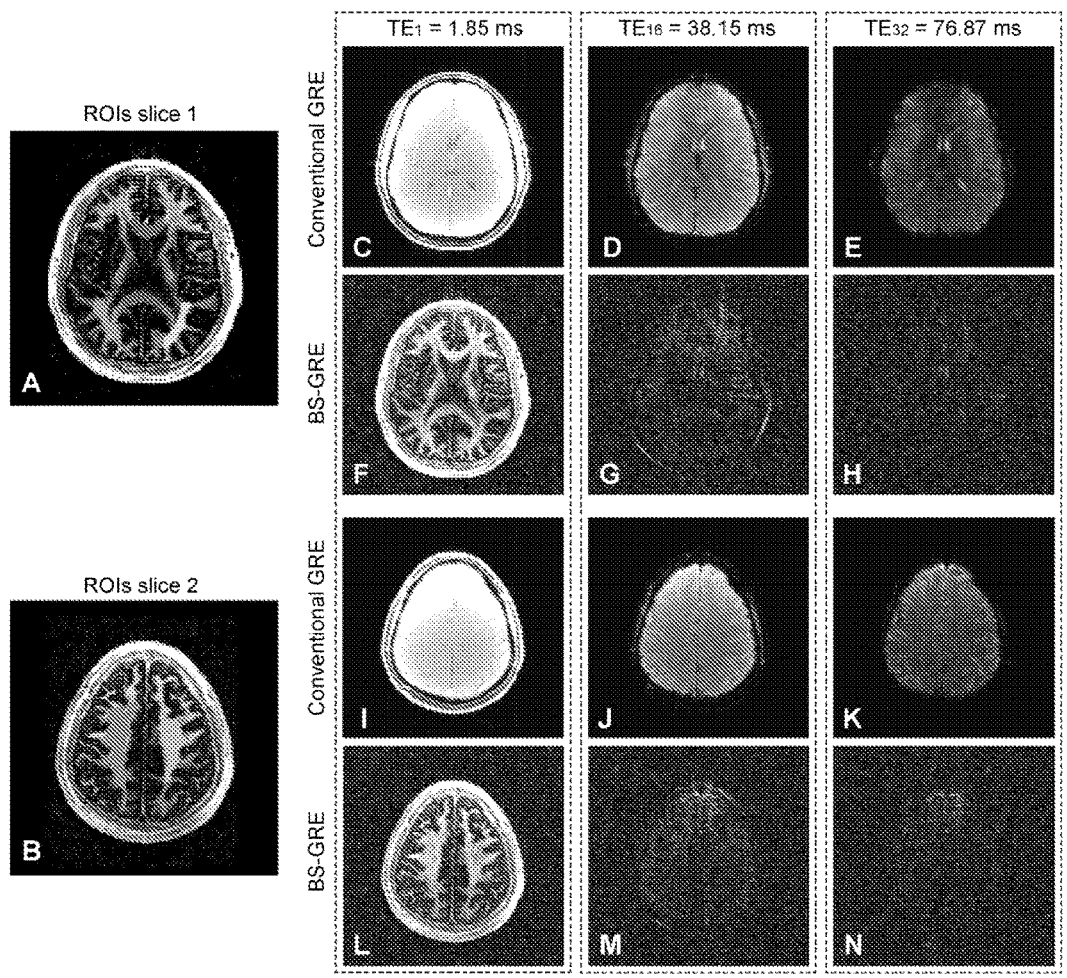
FIGS. 4A and 4B show six regions of interest (ROIs), genu, splenium, left-posterior WM, right-posterior WM, left-superior WM, and right-superior WM used for the analysis.
FIGS. 4C-4E show the first, $16^{th}$ and last echo images from the conventional GRE at the lower slice.
FIGS. 4F-4H show the same three echoes from the BS-GRE at the lower slice. Images at the upper slice from the conventional GRE are shown in FIGS. 4I-4K and the BS-GRE in FIGS. 4L-4N. At the last echo of the BS-GRE images (FIGS. 4H and 4N), white matter structures are invisible.

The images from the conventional and the BS-GRE scans are shown in FIG. 4. FIGS. 4A and 4B show six regions of interest (ROIs), genu, splenium, left-posterior WM, right-posterior WM, left-superior WM, and right-superior WM used for the analysis. FIGS. 4C-4E show the first, 16$^{th}$ and last echo images from the conventional GRE at the lower slice. FIGS. 4F-4H show the same three echoes from the BS-GRE at the lower slice. Images at the upper slice from the conventional GRE are shown in FIGS. 4I-4K and the BS-GRE in FIGS. 4L-4N. At the last echo of the BS-GRE images (FIGS. 4H and 4N), white matter structures are invisible. Only inflow artifacts in the phase encoding direction (anterior-posterior) are noticeable.

In both methods and both slices, the image intensities decrease with increasing echo times (FIGS. 4C to 4N). In the conventional GRE, the last echo images (TE=76.87 ms) still show substantial signal intensities (FIGS. 4E and 4K). In contrast, in the last echo BS-GRE images (FIGS. 4H and 4N), most of the areas are at the level of background noise. The only observable signals are from CSF and vessels which induced inflow artifacts in the phase encoding direction (anterior-posterior).

The signal decay curves and the $T_2^*$ distributions estimated by the regularized-NNLS fitting are shown in FIG. 5. FIG. 5 shows signal decays over the 32 echoes in the conventional GRE (FIG. 5A) and the BS-GRE (FIG. 5C). Each line corresponds with the respective ROIs (genu—solid, splenium—long dashed, left posterior white matter—dash-dotted, right posterior white matter—dash-double-dotted, left superior white matter—short dashed, and right superior white matter—dotted). The BS-GRE signals decay much more rapidly as compared to those of the conventional GRE. The resulting $T_2^*$ distributions (FIG. 5D) suggest that the primary $T_2^*$ decays are less than 20 ms suggesting the signals are predominantly from the myelin water. On the other hand, the conventional MWI results (FIG. 5B) show the signal dominance from the long $T_2^*$ components ($T_2^*>20$ ms).

Each line is coded the same as the ROIs in FIGS. 4A and 4B. Compared to the decay curves from the conventional GRE scans (FIG. 5A), the BS-GRE signals decay much more rapidly reaching the noise level after TE=60 ms. The slight offset from the noise level may have originated from the inflow artifacts observed in FIGS. 4H and 4N. These results suggest that the BS-GRE signals have shorter $T_2^*$ than that of the conventional GRE signals.

Compared to other ROIs, the signal from genu decays faster in the conventional GRE (FIG. 5A). On the other hand, it decays slower in the BS-GRE (FIG. 5C). The slower decay in the BS-GRE may have originated from the inflow artifacts intruding into the genu area resulting in unwanted additional signals (FIGS. 4G and 4H). The rapid $T_2^*$ decay in the conventional GRE is from the field inhomogeneity effects (Hwang, et al., 2010, In vivo multi-slice mapping of myelin water content using T2* decay, NeuroImage 52, 198-204). These differences in the signal decays are also observed in the $T_2^*$ distribution plots where shortened $T_2^*$ distributions are observed in the conventional GRE (FIG. 5B) and a larger portion of the long $T_2^*$ components is observed in the BS-GRE (FIG. 5D). Since these are most likely from the artifacts, the results from genu are excluded from the ROI averages (Table 1).

TABLE 1

List of the short $T_2^*$ fractions at ROIs (mean ± standard deviation).

| | Fraction of short $T_2^*$ component | |
|---|---|---|
| | Conventional MWI | BS-MWI |
| Genu | — | — |
| Splenium | 8.2 ± 1.5% | 87.3 ± 6.1% |
| Left Posterior WM | 4.8 ± 1.1% | 89.2 ± 7.3% |
| Right Posterior WM | 4.9 ± 1.5% | 91.8 ± 4.5% |
| Left Superior WM | 5.6 ± 1.7% | 94.7 ± 1.4% |
| Right Superior WM | 6.1 ± 2.2% | 94.1 ± 4.7% |
| Mean | 5.9 ± 1.4% | 91.4 ± 3.2% |

The $T_2^*$ distributions from the conventional GRE (FIG. 5B) show similar distributions to those from literatures yielding a small fraction of the short $T_2^*$ component (5.9±1.4%; an average of all subjects hereafter). In contrast, the BS-GRE results demonstrate that the primary signals in the BS-GRE are from the short $T_2^*$ component (91.4±3.2%) whose $T_2^*$ is in the range of the myelin water (<20 ms). A difference was observed between the location of short $T_2^*$ peaks between the conventional GRE and the BS-GRE. This difference may have originated from the sensitivity of the NNLS method to noise (Cover. 2008; Whittall and MacKay, 1989).

The $T_2^*$ decays and distributions of the BS-GRE suggest that suppressing long $T_1$ components leaves the signal to originate primarily from the myelin water. This confirms that the myelin water has short $T_1$ in the range of a few hundred milliseconds at 3 T. Generally speaking, a $T_1$ longer than 400 ms at 1.5 T or 3 T and longer than 500 ms at 7 T is considered to be a "long" $T_1$ as used herein, while a $T_1$ shorter than 400 ms at 1.5 T or 3 T and shorter than 500 ms at 7 T is considered to be a "short" $T_1$ as used herein. However, practical examples show that the $T_1$ of myelin water is typically 300 ms or less at 1.5 T and 3 T and 400 ms or less at 7 T and suppression of $T_1$ greater than approximately 500 ms at 1.5 T, 600 ms at 3 T, and 800 ms at 7 T provides clinically acceptable myelin water images. As will be appreciated by those skilled in the art, the range changes with field strength.

In FIG. 6, the results of the myelin water fraction from the conventional MWI are compared to the BS-MWI images generated by averaging the first five echoes of the BS-GRE data. Compared to the conventional MWI images, the BS-MWI images show less speckle artifacts, resulting in a superior image quality. FIG. 6 illustrates conventional MWI (FIGS. 6A and 6C) vs. background-suppressed MWI (FIGS. 6B and 6D). In the conventional MWI, the myelin water fraction was estimated from the multi-echo GRE data using a regularized NNLS method. $T_2^*$ of 20 ms or less was regarded as the myelin water components. The BS-MWI images were generated by averaging the first 5 echoes (up to TE=11.53 ms) from the BS multi-echo GRE data. The BS-MWI images show higher quality than the conventional MWI images.

In the BS-MWI images, a few other areas, that are unrelated to the myelin water, are also visible. For example, arteries are highlighted due to the inflow effects. The skull area has high signal which might be from an imperfect fat saturation. However, in white matter, the primary signal is from the myelin water.

A high-resolution MWI image is shown in FIG. 7. FIG. 7 shows high resolution (1×1×3 mm$^3$) background-suppressed MWI. The total scan time (2 averages) was 9 min 54 sec. The detailed structure of the white matter myelin is observed. This result may provide clinically useful information for the diagnosis of myelin integrity.

Since the myelin water imaging method of the invention is based on the difference in longitudinal relaxation among water components in white matter, it is important to have $T_1$ of the myelin water short and that of the other water components long to have substantially different suppression levels. Otherwise, the myelin water image will be contaminated by the other components. In experiments, the ROI analysis suggests that the myelin water signal dominates the new myelin water images with the average myelin water fraction of 91.4±3.2%. When the $T_1$ of the myelin water is assumed to be 150 ms and that of the other water to be 750 ms, the resulting myelin water signal in the BS-GRE sequence is 59% of the myelin water $M_0$ ($M_{0\_myelin\_water}$) whereas it is 0.3% of the other $M_0$ ($M_{0\_other\_water}$). Assuming a 1:9 ratio between the myelin water and the other water, the resulting myelin water fraction is 96%. Hence, this estimation is comparable to that of the experiment.

In the new sequence, $T_1$ of the myelin water is an important design parameter to optimize the sequence. However, measuring the myelin water $T_1$ is challenging due to the small fraction (<20%) and the short relaxation time ($T_2^*$<20 ms at 3 T). A seemingly straight-forward approach of fitting multiple exponential recoveries to inversion recovery data requires high SNR and a large number of inversion times to reliably separate multiple $T_1$ components (Kalantari, et al., 2011, Insight into in vivo magnetization exchange in human white matter regions, Magn Reson Med 66, 1142-1151). Previous studies using various approaches agree that the myelin water has shorter $T_1$ than that of the other water components but these experiments were performed at different field strengths and the estimated values varied (Does and Gore, 2002; Koenig et al., 1990; Labadie et al., 2009; Lancaster et al., 2002; Stanisz et al., 2005). Once the $T_1$ value is known, a better sequence timing can be designed to improve SNR of the BS-MWI.

In this study, the timing was chosen to have a less than 0.5% contribution from long $T_1$ components. This is a strict level and can be modified to increase SNR of the BS-MWI. For example, a choice of $TI_1$=1000 ms, $TI_2$=350 ms, and TD=740 ms will increase the short $T_1$ signal at $T_1$=150 ms from 59% to 84% of $M_{0\_myelin\_water}$ while keeping long $T_1$ (≥750 ms) less than 1.8% of $M_{0\_other\_water}$. This change will increase the myelin water signal by 42% while keeping 84% of signal from the myelin water assuming a 9:1 ratio for long to short $T_1$ components. TR will be increased but can be used to acquire more slices by interleaving in 2D multi-slice imaging.

It has been studied that the (averaged) $T_1$ of white matter changes with age (Cho, et al., 1997, Establishing norms for age-related changes in proton T1 of human brain tissue in vivo, Magn Reson Imag 15, 1133-1143; Deoni, et al., 2012, Investigating white matter development in infancy and early childhood using myelin water faction and relaxation time mapping, NeuroImage 63, 1038-1053). The value rapidly decreases with increasing myelination at an early developmental stage (Deoni et al., 2012). It continues to decrease slightly and plateaus around the age of 30 to 40. Then the value increases gradually with age (Cho et al., 1997). No information of myelin water $T_1$ change with age is available and additional studies are necessary for the optimum design of the BS-MWI sequence.

In multiple sclerosis patients, increased $T_1$ has been reported in lesions and normal appearing white matter (Bluestein, et al., 2012, T1 and proton density at 7 T in patients with multiple sclerosis: an initial study, Magn Reson Imag 30, 19-25; Parry, et al., 2002, White matter and lesion T1 relaxation times increase in parallel and correlate with disability in multiple sclerosis, J Neurol 249, 1279-1286). No report on myelin water $T_1$ changes has been found in the patients. When white matter is demyelinated, the myelin water fraction decreases (Mackay et al., 1994) and restricted water molecules are mobilized increasing $T_1$. In the BS-MWI, the signal will be reduced for both decreased myelin water fraction and increased $T_1$. Hence the method is expected to be sensitive to demyelination.

In the experiments, the BS-MWI was compared with GRE-based MWI. The GRE-based MWI method requires less specific absorption rate and provides large volume coverage as compared with SE-based MWI. However, the GRE-based method suffers from $B_0$ field inhomogeneity, which was observed in the results (e.g. genu area in FIG. 6A). Techniques have been proposed to compensate for the field inhomogeneity effects and have shown to improve the GRE-based MWI images (Hwang, et al., 2009, Improved myelin water quantification using spatially regularized non-negative least squares algorithm, J Magn Reson Imag 30, 203-208; Hwang, et al., 2010, In vivo multi-slice mapping of myelin water content using T2* decay, NeuroImage 52, 198-204). Different from GRE-based MWI, the novel BS-MWI method does not require multiple echoes and can generate myelin water images near an inhomogeneous field with no compensation (see FIGS. 6B and 7). If it is necessary to acquire data near a large field inhomogeneity area (e.g. an orbitofrontal lobe at 7 Tesla), a SE acquisition can be implemented.

Another approach of generating myelin water fraction has been proposed by estimating multiple relaxation parameters (Deoni, et al., 2003, Rapid combined T1 and T2 mapping using gradient recalled acquisition in the steady state, Magn Reson Med 49, 515-526). Compared to the present approach, the method requires multiple sequences and complex data processing including $B_0$ and $B_1$ corrections (Deoni, S. C. L., 2011, Correction of main and transmit magnetic field (B0 and B1) inhomogeneity effects in multicomponent-driven equilibrium single-pulse observation of T1 and T2, Magn Reson Med 65, 1021-1035).

In the experiments described above, the flip angles of the conventional MWI scans were optimized for the averaged white matter $T_1$ (=750 ms). This may not be optimal for the myelin water signal. The SNR of the myelin water image can be increased by using a larger flip angle. However, since $T_1$ of the myelin water is unknown, it is unclear what the optimum flip angle should be particularly for the short TR scan.

In the conventional MWI, a myelin water fraction map provides a quantitative amount of the myelin water to total water. The new BS-MWI alone does not provide this information. If the long components are properly suppressed, an additional scan that measures proton density and $T_1$ can be used to generate a quantitative myelin water fraction map. Quantification can be important in certain applications (Stikov, et al., 2011, Bound pool fractions complement diffusion measures to describe white matter micro and macrostructure, NeuroImage 54, 1112-1121) but it may not be necessary for the identification of demyelinated lesions.

For clinical applications, extension of the current method to cover a 3D volume is important. This can be achieved using a 2D multi-slice or a 3D acquisition. In a 2D multi-slices acquisition, multiple slices can be interleaved to acquire a 3D volume more efficiently. Compared to the 2D multi-slice approach, a 3D acquisition will have a lower specific absorption rate. The acquisition can be designed with a radial, spiral, or cone trajectory to reduce the scan time. These trajectories have an additional advantage of acquiring the center of the k-space before a $T_2^*$ decay.

Recently, several new approaches have been proposed to assess the integrity of myelin using magnetic susceptibility in myelin (Cohen-Adad, et al., 2012, T2* mapping and B0 orientation-dependence at 7 T reveal cyto- and myeloarchitecture organization of the human cortex, NeuroImage 60, 1006-1014; Duyn, et al., 2007. High-field MRI of brain cortical substructure based on signal phase, Proc Natl Acad Sci USA 104, 11796-11801; Lee, et al., 2010, Sensitivity of MRI resonance frequency to the orientation of brain tissue microstructure, Proc Natl Acad Sci USA 107, 5130-5135; Lee, et al., 2011, T2*-based fiber orientation mapping, NeuroImage 57, 225-234; Li, et al., 2012, Mapping Magnetic Susceptibility Anisotropies of White Matter in vivo in the Human Brain at 7 Tesla, NeuroImage 62, 314-330; Liu, C., 2010, Susceptibility tensor imaging, Magn Reson Med 63, 1471-1477; Miller, et al., 2010, Asymmetries of the balanced SSFP profile. Part II: White matter, Magn Reson Med 63, 396-406) or protons in myelin (Wilhelm, et al., 2012, Direct magnetic resonance detection of myelin and prospects for quantitative imaging of myelin density, PNAS 109, 9605-9610). These data, in conjunction with diffusion and magnetization transfer data, may provide complimentary information to MWI and the combination of these may help us to better understand the biophysics of white matter.

Thus, a new approach to acquire high quality myelin water images is proposed that utilizes a multiple inversion RF scheme to suppress long $T_1$ water signals. After the suppression, a short $T_2^*$ component, which has been associated to the myelin water, dominated the image. Using this approach, a high-resolution MWI image has been demonstrated. The extension of the proposed method in 3D with a proper SNR will help the inventors to apply this method to clinical applications including the diagnosis of multiple sclerosis.

Those skilled in the art will also appreciate that the invention may be applied to other applications and may be modified without departing from the scope of the invention. For example, the radiofrequency pulses described herein are those used for a nuclear magnetic resonance spectroscopy or imaging experiments. The sequence may be used as an imaging technique for diagnosis of many diseases including, for example, adrenoleukodystrophy (ALD), metachromatic leukodystrophy, and carpal tunnel syndrome, all of which involve damage to myelin. The sequence also may be used as an imaging technique for diagnosis or detection of short T1 component(s) not related to myelin water if the short T1 component(s) is mixed with long T1 components and the T1 values among short and long T1 components are substantially different to be separable by the proposed method. The pulse sequence may also be used as an imaging tool for viewing the biomechanics and/or biochemistry of tissues and the progression of disease, tissue repair, or the effects of pharmaceutical agents on the tissues. Generally, the radiofrequency pulses described herein may have any frequency and may be used for other applications such as electron paramagnetic resonance. Accordingly, the scope of the invention is not intended to be limited to the exemplary embodiments described above, but only by the appended claims.

What is claimed:

1. A method of acquiring a myelin water image comprising:
    applying RF pulses to suppress signals from long $T_1$ components so that a short $T_1$ signal including a myelin water component dominates a resulting image of a region of interest;
    applying an excitation RF pulse to the region of interest; and
    acquiring image data in the region of interest for display of a myelin water image.

2. The method of claim 1, wherein said RF suppression pulses suppress T1 signals longer than 400 ms for 1.5 T or 3 T fields or longer than 500 ms for 7 T fields.

3. The method of claim 1, wherein the RF suppression pulses comprise double or multiple inversion RF pulses sufficient to remove long T1 water signals unrelated to myelin water.

4. The method of claim 3, wherein the applying steps apply a pulse sequence, satisfying either the following equation for two inversion pulses:

$$M_{xy} = M_0(1-(2-(2-\epsilon^{-TD/T_1})\epsilon^{-TI_1/T_1})\epsilon^{-TI_2/T_1})\epsilon^{-TE/T_2^*}$$

where $M_0$ is a fully relaxed magnetization value, $TI_1$ is a time duration from a first inversion RF pulse to a second inversion RF pulse, $TI_2$ is a time duration from the second inversion RF pulse to the excitation RF pulse, and TD is a time duration from the excitation RF pulse to a first inversion RF pulse in a subsequent pulse sequence $M_{xy}$, TE is an echo pulse duration, and $M_{xy}$ is a transverse magnetization after the excitation RF at TE;

or the following equation for three inversion pulses:

$$M_{xy} = M_0(1-(2-(2-(2-\epsilon^{-TD/T_1})\epsilon^{-TI_1/T_1})\epsilon^{-TI_2/T_1})\epsilon^{-TI_3/T_1})\epsilon^{-TE/T_2^*}$$

where $M_0$ is a fully relaxed magnetization value, $TI_1$ is a time duration from a first inversion RF pulse to a second inversion RF pulse, $TI_2$ is a time duration from the second inversion RF pulse to the third inversion RF pulse, $TI_3$ is a time duration from the third inversion RF pulse to the excitation RF pulse, and TD is a time duration from the excitation RF pulse to a first inversion RF pulse in a subsequent pulse sequence, TE is an echo pulse duration, and $M_{xy}$ is a transverse magnetization after the excitation RF at TE;

or the following equation for four inversion pulses:

$$M_{xy} = M_0(1-(2-(2-(2-(2-\epsilon^{-TD/T_1})\epsilon^{-TI_1/T_1})\epsilon^{-TI_2/T_1})\epsilon^{-TI_3/T_1})\epsilon^{-TI_4/T_1})\epsilon^{-TE/T_2^*}$$

where $M_0$ is a fully relaxed magnetization value, $TI_1$ is a time duration from a first inversion RF pulse to a second inversion RF pulse, $TI_2$ is a time duration from the second inversion RF pulse to the third inversion RF pulse, $TI_3$ is a time duration from the third inversion RF pulse to the fourth inversion RF pulse, $TI_4$ is a time duration from the fourth inversion RF pulse to the excitation RF pulse, and TD is a time duration from the excitation RF pulse to a first inversion RF pulse in a subsequent pulse sequence, TE is an echo pulse duration, and $M_{xy}$ is a transverse magnetization after the excitation RF at TE.

5. The method of claim 1, wherein the excitation RF pulse comprises a 90° excitation RF pulse.

6. The method of claim 1, wherein the region of interest is a slice of or a part or whole brain of a subject.

7. A system for acquiring a myelin water image, comprising:
    an RF pulse generator that generates RF pulses adapted to suppress signals from long $T_1$ components so that a short $T_1$ signal including a myelin water component dominates a resulting image of a region of interest when the RF pulses are applied to the region of interest, said RF pulse generator further generating an excitation RF pulse for application to the region of interest; and a data acquisition element adapted to acquire image data in the region of interest for display of a myelin water image generated in response to application of said RF pulses and RF excitation pulse to the region of interest.

8. The system of claim 7, wherein said RF suppression pulses suppress T1 signals longer than 400 ms for 1.5 T or 3 T fields or longer than 500 ms for 7 T fields.

9. The system of claim 7, wherein the RF suppression pulses comprise double or multiple inversion RF pulses sufficient to remove long T1 water signals unrelated to myelin water.

10. The system of claim 9, wherein the RF pulse sequence applied to the region of interest by the RF pulse generator satisfies either the following equation for two inversion pulses:

$$M_{xy}=M_0(1-(2-(2-\epsilon^{-TD/T1})\epsilon^{-T1_1/T1})\epsilon^{-T1_2/T1})\epsilon^{-TE/T2*}$$

where $M_0$ is a fully relaxed magnetization value, $T1_1$ is a time duration from a first inversion RF pulse to a second inversion RF pulse, $T1_2$ is a time duration from the second inversion RF pulse to the excitation RF pulse, and TD is a time duration from the excitation RF pulse to a first inversion RF pulse in a subsequent pulse sequence $M_{xy}$, TE is an echo pulse duration, and $M_{xy}$ is a transverse magnetization after the excitation RF at TE;

or the following equation for three inversion pulses:

$$M_{xy}=M_0(1-(2-(2-(2-\epsilon^{-TD/T1})\epsilon^{-T1_1/T1})\epsilon^{-T1_2/T1})\epsilon^{-T1_3/T1})\epsilon^{-TE/T2*}$$

where $M_0$ is a fully relaxed magnetization value, $T1_1$ is a time duration from a first inversion RF pulse to a second inversion RF pulse, $T1_2$ is a time duration from the second inversion RF pulse to the third inversion RF pulse, $TI_3$ is a time duration from the third inversion RF pulse to the excitation RF pulse, and TD is a time duration from the excitation RF pulse to a first inversion RF pulse in a subsequent pulse sequence, TE is an echo pulse duration, and $M_{xy}$ is a transverse magnetization after the excitation RF at TE;

or the following equation for four inversion pulses:

$$M_{xy}=M_0(1-(2-(2-(2-(2-\epsilon^{-TD/T1})\epsilon^{-T1_1/T1})\epsilon^{-T1_2/T1})\epsilon^{-T1_3/T1})\epsilon^{-T1_4/T1})\epsilon^{-TE/T2*}$$

where $M_0$ is a fully relaxed magnetization value, $T1_1$ is a time duration from a first inversion RF pulse to a second inversion RF pulse, $T1_2$ is a time duration from the second inversion RF pulse to the third inversion RF pulse, $TI_3$ is a time duration from the third inversion RF pulse to the fourth inversion RF pulse, $TI_4$ is a time duration from the fourth inversion RF pulse to the excitation RF pulse, and TD is a time duration from the excitation RF pulse to a first inversion RF pulse in a subsequent pulse sequence, TE is an echo pulse duration, and $M_{xy}$ is a transverse magnetization after the excitation RF at TE.

11. The system of claim 7, wherein the excitation RF pulse comprises a 90° excitation RF pulse.

12. The system of claim 7, wherein the region of interest is a slice of or a part or whole brain of a subject.

* * * * *

UNITED STATES PATENT AND TRADEMARK OFFICE
CERTIFICATE OF CORRECTION

PATENT NO. : 9,851,425 B2
APPLICATION NO. : 14/647664
DATED : December 26, 2017
INVENTOR(S) : Jongho Lee et al.

Page 1 of 1

It is certified that error appears in the above-identified patent and that said Letters Patent is hereby corrected as shown below:

In the Specification

Column 1
Lines 16-21, delete "This invention was made with government support under Grant No. 8P41-EB015893 awarded by the National Center for Research Resources, NIBIB of NIH and Penn Comprehensive Neuroscience Center Pilot Grant, University of Pennsylvania. The government has certain rights in the invention." and insert --This invention was made with government support under Grant Number EB015893 awarded by the National Institutes of Health. The government has certain rights in the invention.--

Signed and Sealed this
Nineteenth Day of February, 2019

Andrei Iancu
*Director of the United States Patent and Trademark Office*